(12) United States Patent
Hung

(10) Patent No.: US 8,125,235 B2
(45) Date of Patent: Feb. 28, 2012

(54) APPARATUS FOR MASS DIE TESTING

(75) Inventor: Tsung-Yang Hung, Jhubei (TW)

(73) Assignee: Taiwan Semicondutor Manufacturing Co., Ltd., Hsin-Chu (TW)

(*) Notice: Subject to any disclaimer, the term of this patent is extended or adjusted under 35 U.S.C. 154(b) by 64 days.

(21) Appl. No.: 12/772,928

(22) Filed: May 3, 2010

(65) Prior Publication Data

US 2010/0244879 A1 Sep. 30, 2010

Related U.S. Application Data

(62) Division of application No. 11/600,973, filed on Nov. 17, 2006, now abandoned.

(51) Int. Cl.
G01R 31/20 (2006.01)
(52) U.S. Cl. .................. 324/754.07; 324/762.05
(58) Field of Classification Search .......... 324/763, 324/754.07, 762.05
See application file for complete search history.

(56) References Cited

U.S. PATENT DOCUMENTS

| 5,838,163 | A | 11/1998 | Rostoker et al. ............ 324/763 |
| 6,300,786 | B1* | 10/2001 | Doherty et al. ............ 324/765 |
| 6,756,777 | B2 | 6/2004 | Prazeres da Costa et al. ............ 324/158.1 |
| 7,345,493 | B2 | 3/2008 | Khandros et al. ............ 324/765 |
| 2002/0186004 | A1* | 12/2002 | Prazeres da Costa et al. ............ 324/158.1 |
| 2006/0125508 | A1 | 6/2006 | Glidden et al. ............ 324/765 |
| 2007/0040447 | A1 | 2/2007 | Kim et al. ............ 307/11 |

* cited by examiner

Primary Examiner — Ha Tran T Nguyen
Assistant Examiner — Shaun Campbell
(74) Attorney, Agent, or Firm — K&L Gates LLP

(57) ABSTRACT

A test system for testing a large number of dice on a semiconductor wafer without repositioning test probes is disclosed. The test system includes a set of dice under test (DUT) connected together by a plurality of signal buses formed on a semiconductor wafer, at least one test die designed for carrying out tests of the dice under test, the test die having a set of pads to be connected to one or more probes of an external test apparatus, and a probe card with at least one multiplexer implemented in the probe card, such that the test die is capable of receiving signals from the external test apparatus to select any die under test within the set via the multiplexer and the signal buses without repositioning the probes.

20 Claims, 9 Drawing Sheets

APPARATUS FOR MASS DIE TESTING

CROSS REFERENCES

This application is a Divisional Application of U.S. Ser. No. 11/600,973, filed on Nov. 17, 2006, entitled: APPARATUS FOR MASS DIE TESTING, which is now pending.

BACKGROUND

The present invention relates generally to integrated circuit (IC) designs, and more particularly to an apparatus for testing a large number of dice on a semiconductor wafer without repositioning test probes.

A semiconductor wafer typically contains a large number of dice constructed on a round-shaped semiconductor substrate. Each die embodies a complex integrated circuit formed by semiconductor processing technology, such as chemical vapor deposition, thermal oxidation, ion implantation, lithography, etching, and metallization, to carry out certain functionalities. These dice need to be tested to determine whether they meet predefined specifications, before they can be separated from the wafer for individual package. Conventionally, each die may include one or more pads that can be used to form electrical contacts with test probes of an external test machine. The test machine sends out test signals and receives resultant signals to and from the die under test (DUT) via the test probes and the pads. The resultant signal contains information with respect to the DUT, and can be further analyzed by the test machine to determine whether the DUT meet those predefined specifications.

One drawback of the conventional die testing scheme is that it is very time consuming. Every time when the test machine tests a new die, the test probes need to be repositioned from a previous DUT to form electrical contacts with the pads of the new die. Every repositioning of probes may take seconds, and a semiconductor wafer usually contains tens to tens of thousands of dice. As a result, a complete test for a semiconductor wafer usually requires a long time, which often represents a significant portion of the manufacturing cost for each die. As the semiconductor processing technology advances, the number of dice on a semiconductor wafer increases significantly, and therefore the manufacturing cost of die also increases dramatically due to the prolonged die testing procedure.

For example, conventional probe testing can only be performed on a few unsorted dice, typically less than 20 DUTs, for each time that the probes are positioned. In order to perform tests on a larger number of DUTs, the probes need to be repositioned. Supposing that 80,000 DUTs on a semiconductor wafer need to be tested, a really long period of time will be needed just for repositioning the probes. In the time-conscious of semiconductor industry, the cost incurred by the testing time is often unacceptable.

As such, desirable in the art of IC designs is an apparatus for testing a large number of dice on a semiconductor wafer without repositioning test probes.

SUMMARY

The present invention discloses a test system for testing a large number of dice on a semiconductor wafer without repositioning test probes. One embodiment of the invention is described herein for explaining the principles of the invention. In the embodiment, a test system includes a set of dice under test (DUT) connected together by a plurality of signal buses formed on a semiconductor wafer, and at least one built-in self test (BIST) die formed separate from the set of DUT, the BIST die being connected to each DUT within the set through the signal buses for carrying out tests of each DUT. The test system further includes a probe card including a set of probes for forming electrical contacts with the DUT via one or more pads on the BIST die, wherein the probe card includes at least one multiplexer. In addition, the test system includes a test apparatus coupled to the probe card for sending test signals to the multiplexer of the probe card to select any DUT within the set, and for receiving output signals from the DUT for analysis through the multiplexer without repositioning the set of probes, the test apparatus includes a control device for analyzing the output signals from the DUT and for providing address signals to the probe card via an addressing bus, the probe card providing a plurality of physical connections to the BIST die for selecting one or more DUTs for testing based on the address signals. The test apparatus further includes a set of testers coupled to the control device, and a set of matching modules configured to couple radio frequency (RF) signals between the probe card and the set of testers.

The construction and method of operation of the invention, however, together with additional objects and advantages thereof will be best understood from the following description of specific embodiments when read in connection with the accompanying drawings.

DESCRIPTION

This invention describes an apparatus for testing a large number of dice on a semiconductor wafer without repositioning test probes. The following merely illustrates various embodiments of the present invention for purposes of explaining the principles thereof. It is understood that those skilled in the art will be able to devise various equivalents that, although not explicitly described herein, embody the principles of this invention.

Figure 1A:
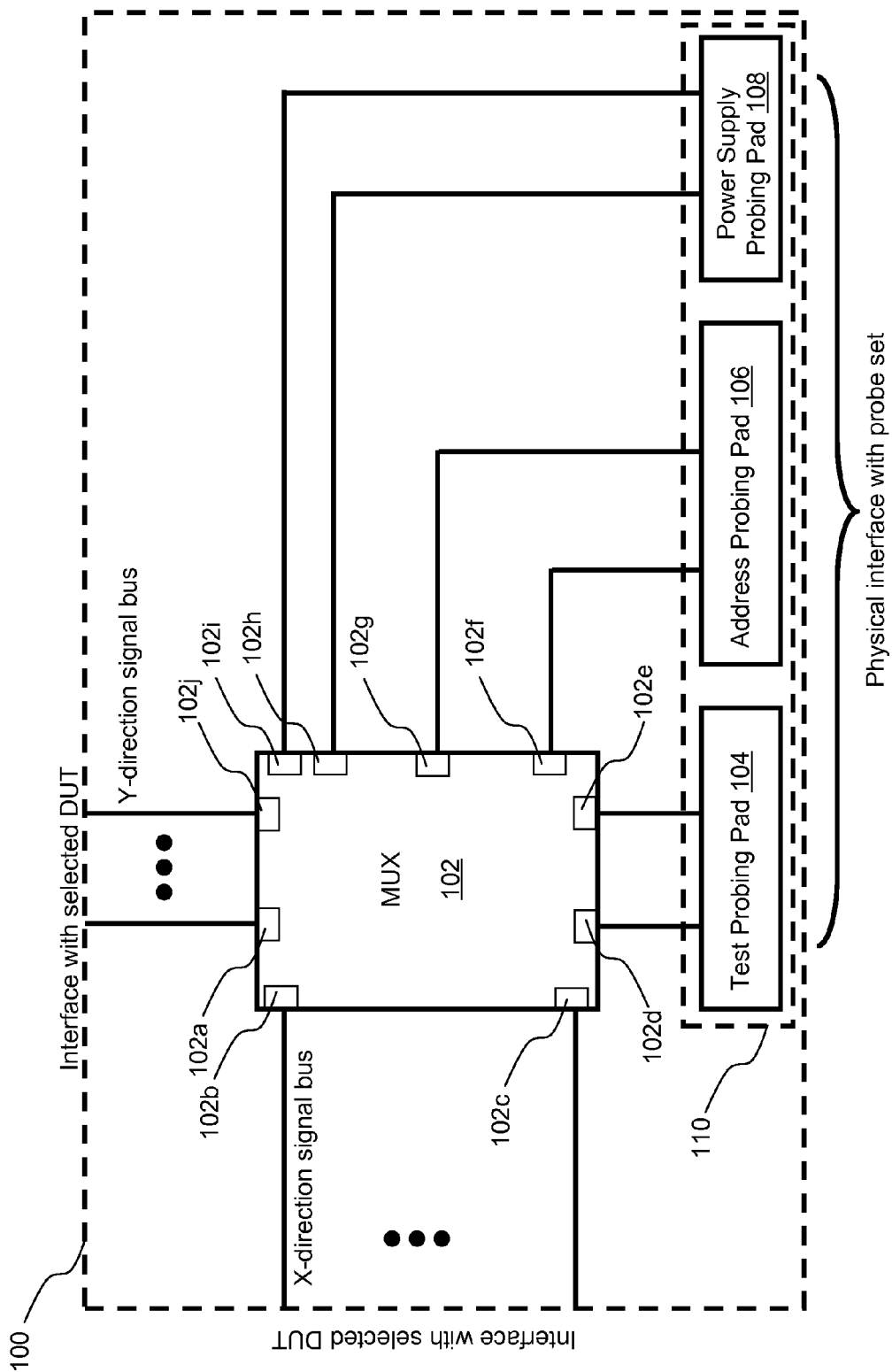
FIG. 1A illustrates a block diagram of a built-in self test (BST) die used for multiplexing test signals to a selected DUT on a semiconductor wafer in accordance with one embodiment of the present invention.

FIG. 1A illustrates a block diagram of a BIST die 100 implemented for performing circuit probing test for RF dice on a semiconductor wafer in accordance with one embodiment of the present invention. It is noted that the RF dice are used merely as an example to explain the principles of the invention, which can be applied to other types of dice, and by no means are limited to RF dice.

The BIST die 100 includes a multiplexer 102, a set of test probing pads 104, a set of address probing pads 106, and a set of power supply probing pads 108. The probing pads 104, 106 and 108 can be collectively referred to as a pad array 110. The multiplexer 102 has a plurality of ports 102a through 102j connected to a plurality of signal buses, including the buses extended to the pad array 110 and the buses extended to other dice on the semiconductor wafer. During test operation, the probing pads 104, 106, and 108 are further coupled to a test apparatus (not shown in this figure), which selects one or more dice on a semiconductor wafer for testing. The multiplexer 102 is also coupled with signal buses 102b and 102a that are placed on a X-direction scribe line and a Y-direction scribe line, respectively, such that a specific DUT may be selected by the multiplexer 102 with address information received at the address probing pads 106 from the test apparatus. When a particular DUT is selected by the BIST die 100, it can be powered up quickly using the power received at the power supply probing pads 108 from the test apparatus or using the DC power converted from an RF signal generated by the test apparatus with the DUT or the BIST die. Various tests can be performed on the selected DUT based on the test signals received at the test probing pads 104 from the test apparatus. In this embodiment, the BIST die 100 is embedded among the dice under test on the semiconductor wafer.

Figure 1B:
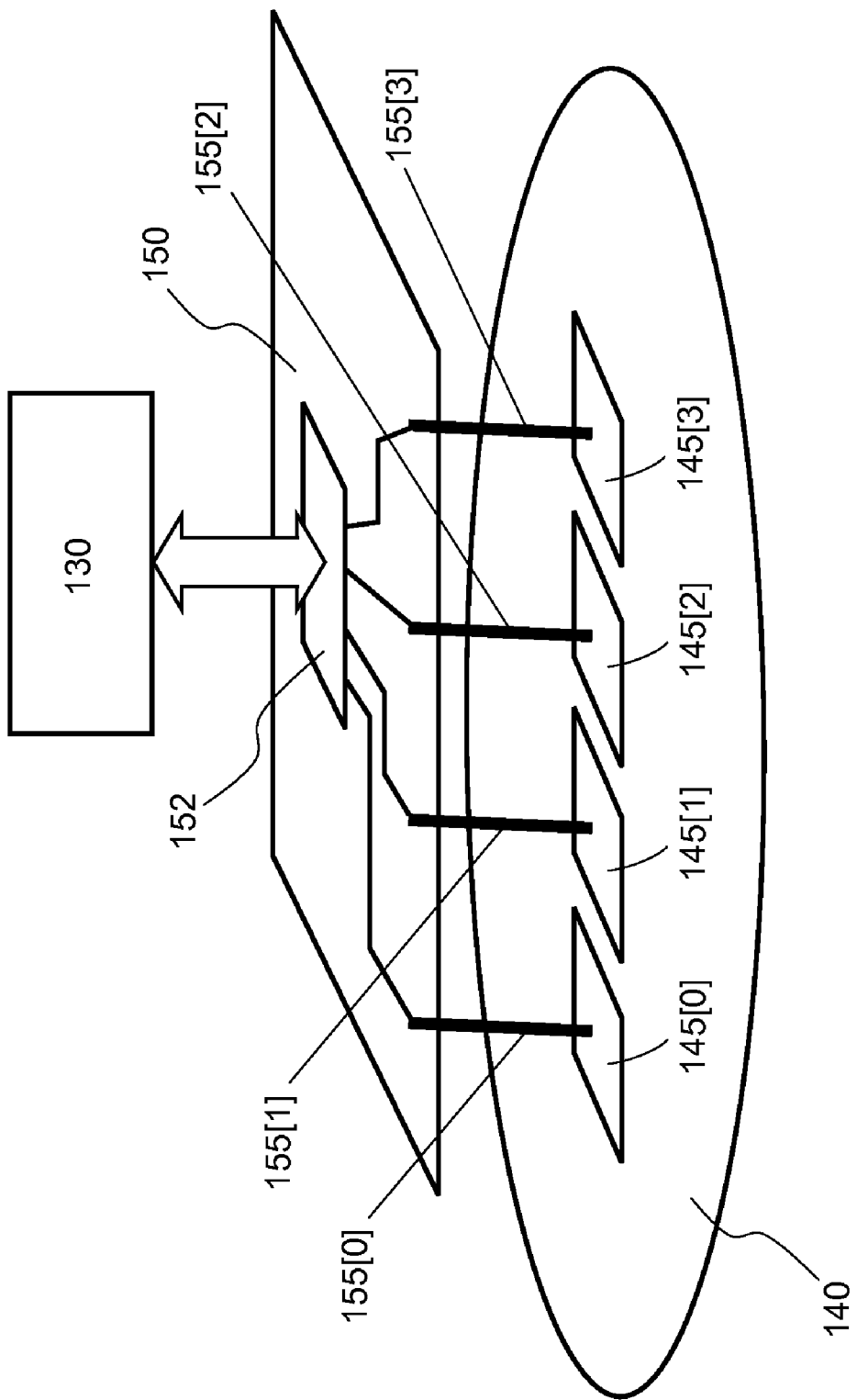
FIG. 1B illustrates a block diagram of a multiplexer built in a probe card for selectively testing multiple DUTs on a semiconductor wafer in accordance with another embodiment of the present invention.
Figure 1C:
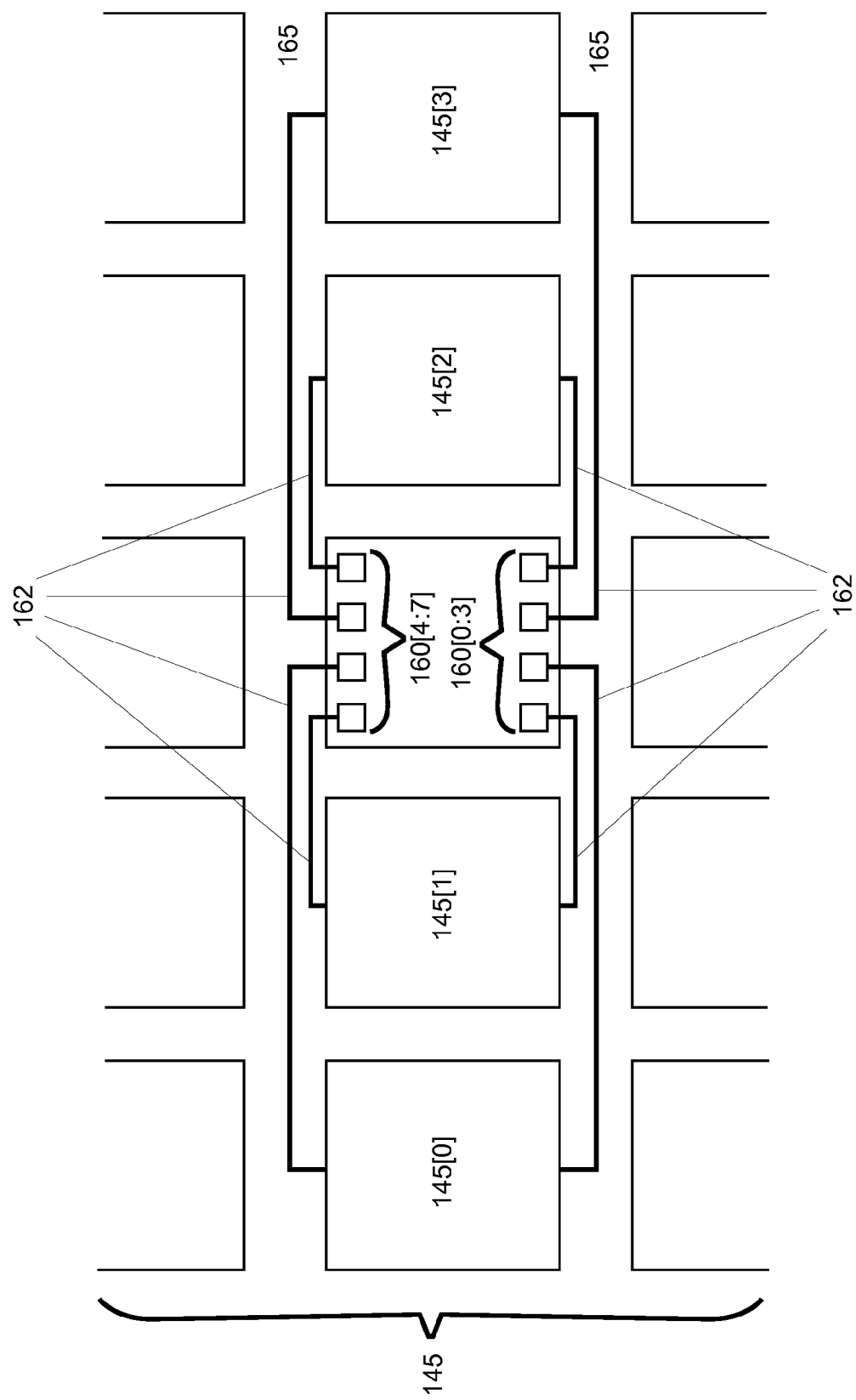
FIG. 1C illustrates a wafer with pads routed to multiple DUTs.

FIG. 1B illustrates another embodiment in which a multiplexer 152 can be implemented on a probe card 150, instead of a semiconductor wafer 140. The multiplexer 152 on the probe card 150 includes a number of ports that allow the multiplexer to couple with a test apparatus 130 for receiving and transmitting test signals, address signals, and power signals there between. The probe card 150 further includes a number of probes 155[0:3] for forming electrical contacts with the DUTs 145[0:3] on the semiconductor wafer 140. In this embodiment where the probe card 150 is used to test RF DUTs 145[0:3], the probes at minimum includes two RF probes for passing RF test signals, two power probes for supplying power, and three digital probes for passing address signals. The semiconductor wafer 140 can be implemented with a number of pads 160[0:7] that function as accesses to the DUTs 145[0:3] through signal buses 162 routed along the scribe lines 165 as shown in FIG. 1C. The probes can be placed on the pads 160[0:7] of the semiconductor wafer 140 to form one or more signal paths among the DUTs 145[0:3] and the test apparatus. The test apparatus can select one or more DUTs 145[0:3], sends out RF test signals, and receives resultant signals from the DUTs 145[0:3] for further analysis to determine whether they meet certain predefined specifications.

Figure 2A:
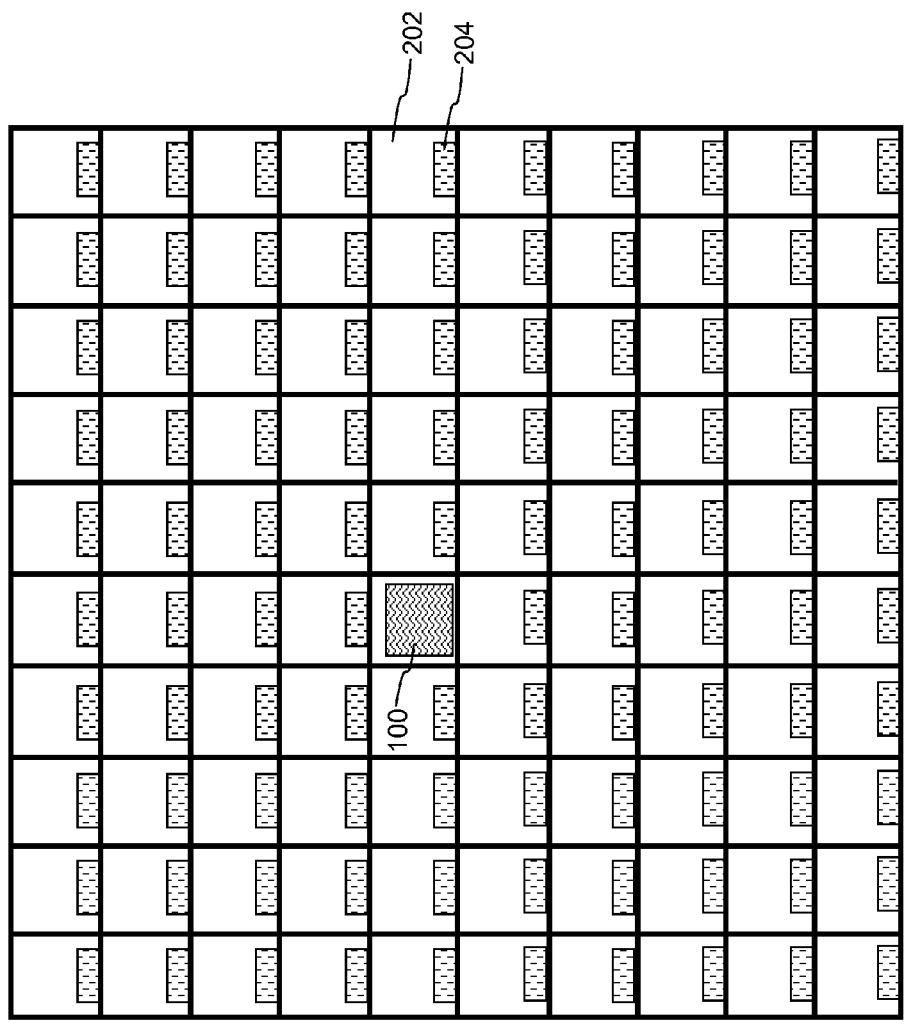
FIG. 2A illustrates a set of DUTs, among which a BIST die is implemented, in accordance with one embodiment of the present invention.

FIG. 2A illustrates a set of DUTs 200, among which a BIST die 100 as shown in FIG. 1 is implemented in accordance with one embodiment of the present invention. The set of DUTs 200, for example, includes 99 DUTs 202 arranged in a 10×10 array. The multiplexer within the BIST die 100 is connected to each DUT within the set 200 through signal buses routed along the scribe lines, which are shown as the dark lines in this figure. Each DUT 202 includes a set of tacks 204 that are extended from the circuit region of the DUT 202 to its surrounding scribe lines to form electrical connections between the electrical components within the DUT 202 and the signal buses on the scribe lines.

When a DUT is being tested, a test apparatus (not shown in the figure) generates testing signals, address signals, and power signals to the multiplexer within the BIST die 100 through contacts formed by its probes and the probing pads on the BIST die 100. The multiplexer utilizes the information carrier by the address signals to select one or more DUTs for testing. Power and test signals are passed onto the selected DUTs via the signal buses. The set of tacks extended from the selected DUT to the scribe line allow the DUT to receive test signals and power from the signal buses. It is noted that although FIG. 2A only shows 99 DUTs, in real applications, the BIST die 100 may be implemented among a set of DUTs with a much larger number, such that the probes will not need to be repositioned for any DUT selected from the set.

Figure 2B:
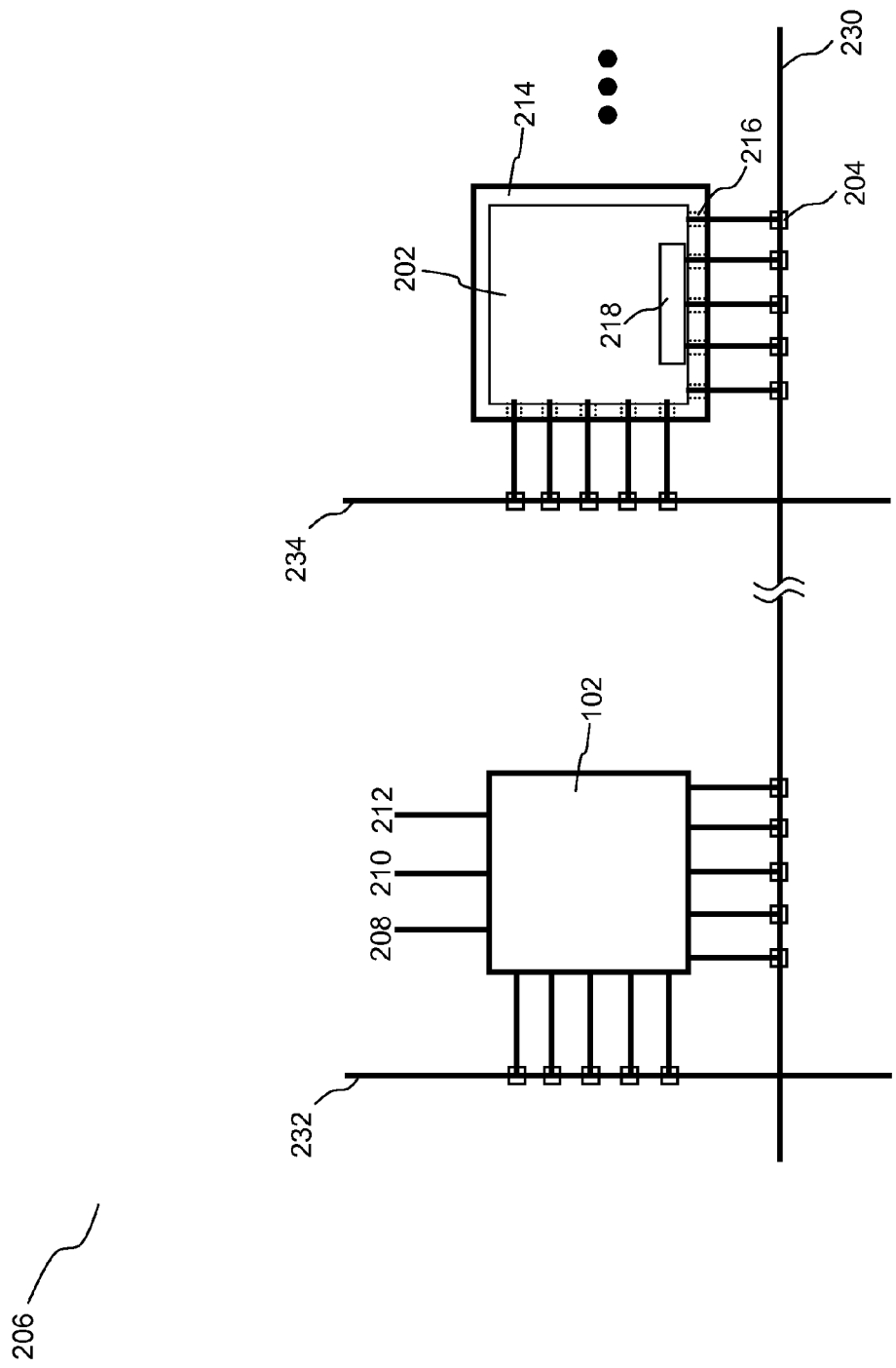
FIG. 2B illustrates a diagram showing a DUT connected to the BIST die via signal buses routed along the scribe lines in accordance with one embodiment of the present invention.

FIG. 2B illustrates an enlarged diagram 206 showing the DUT 202 and the multiplexer 102 of the BIST die are connected via signal buses along the scribe lines in accordance with one embodiment of the present invention. The multiplexer 102 is coupled with the signal buses along an X scribe line 230 and a Y scribe line 232, and it is designed to select a DUT within the array based on the address information provided by address signals received at the address probing pad from an external test apparatus. The multiplexer 102 has a number of ports designed for receiving signals from the probes of the test apparatus that are in contact with its probing pads. In this embodiment, the multiplexer 102 includes a set of RF testing signal ports 208, a set of address ports 210, and a set of power input ports 212. When the DUT 202 is selected using the address information received at the address ports 210, the multiplexer 102 will provide power and RF test signals received at its power and RF ports to the DUT 202 through the signal buses along the scribe lines. It is noted that in one embodiment, the DUT 202 can convert RF power received from the multiplexer 102 into DC power for operation. In such case, the multiplexer 102 will provide only the RF signals without the power signals.

The integrated circuits in the DUT 202 is surrounded by a seal ring 214 that is designed to protect the electrical components within the DUT 202 from the outside environment, once it is cut out from the semiconductor wafer. The DUT 202 is coupled with the signal buses along the X scribe line 230 and a Y scribe line 234 via the tacks 204 disposed there between. The tacks 204, as shown in FIG. 2B, are metal traces deposited at the edges of the DUT 202, and extended to the signal buses on the scribe line. These metal traces are designed to deliver signals, such as the RF test signals, from the multiplexer 102 into the DUT 202, and they are laid on the space of the scribe lines that will eventually be cut off when the dice are separated. In order for the connection to be made between the DUT 202 and the signal buses, a plurality of feed-through paths 216 are constructed through the seal ring 214 for the metal traces to contact with the electrical components within the DUT 202. The DUT 202 has a number of ports including a RF port 218 used for receiving signals from the tacks passing through the seal ring 214.

Figure 2C:
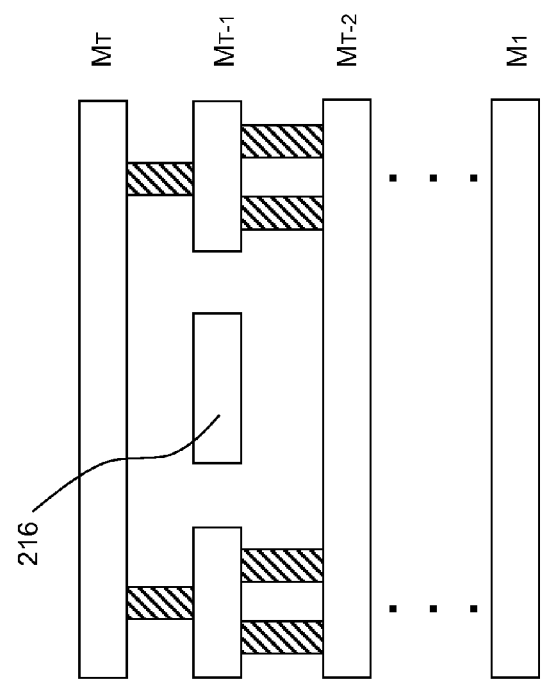
FIG. 2C illustrates a cross-sectional view of the seal ring in accordance with one embodiment of the present invention.

FIG. 2C illustrates a cross-sectional view of the seal ring 214, across which the feed-through paths 216 are disposed, in accordance with one embodiment of the present invention. The feed-through paths 216 can be formed on any metallization layer $M_1 \ldots M_{T-2}$, $M_{T-1}$, or $M_T$ as shown in FIG. 2C. In another embodiment, multiple feed-through paths 216 may be used for complex applications, where the feed-through paths 216 are electrically connected with one another through vias, if required.

Figure 3A:
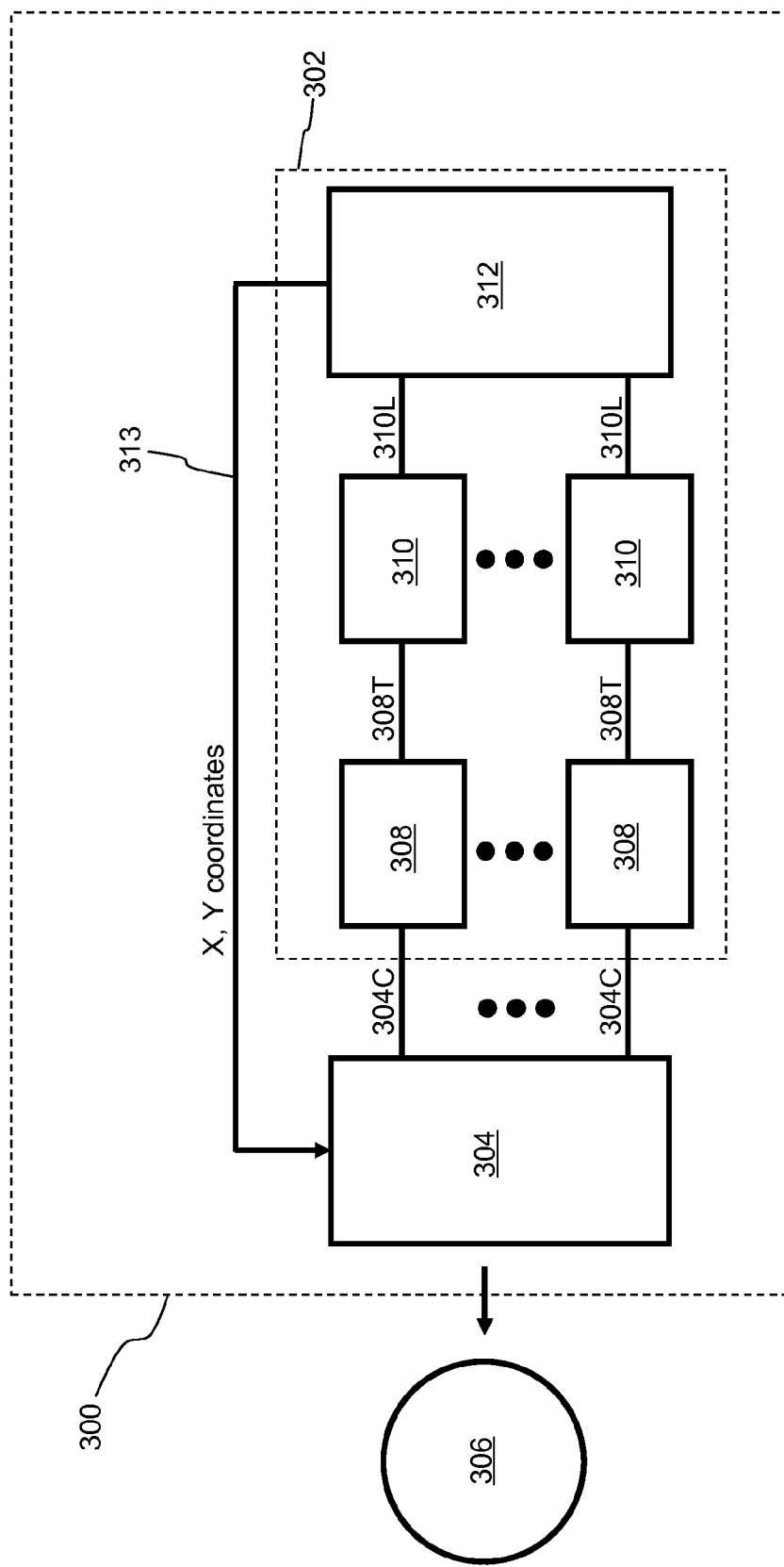
FIG. 3A illustrates a block diagram of a test system designed for testing a plurality of RF dice in accordance with one embodiment of the present invention.

FIG. 3A illustrates a block diagram of a test system 300 designed for testing a large quantity of RF dice on a semiconductor wafer 306 in accordance with one embodiment of the present invention. The test system 300 includes a test apparatus 302 and a probe array 304. The test apparatus 302 further includes a plurality of matching modules 308, a plurality of RF testers 310, and a control device 312.

In this embodiment, the semiconductor wafer 306 contains a large number of RF dice grouped into hundreds of sets of DUTs. Each set of DUTs includes at least one test chip such as the BIST die 100 shown in FIG. 1. Several thousands of DUTs with the set can be selected and tested for each placement of probes based on the address information provided to the BIST die 100 by the control device 312 via an addressing bus 313 and the probe array 304. This addressing bus 313 essentially provides X and Y coordinates that are designated by the control device 312 and received by the probe array 304. The probe array 304 provides physical connections to the BIST die 100 which, based on the X and Y coordinates provided by the addressing bus 313, selects one or more DUTs for testing. During test operation, RF test input signals are provided to the selected DUTs, and the output test signals from the selected DUTs then travel through the multiplexer within the BIST die and the probe array 304 to reach the matching modules 308 via a set of RF cables 304C. The matching modules 308 are designed to couple the RF signals between the probe array 304 and the RF testers 310. Thus, the signals output from the selected DUTs can be sent to the RE tester 310 and control device 312 for further analysis to determine whether they meet certain predetermined specifications.

Figure 3B:
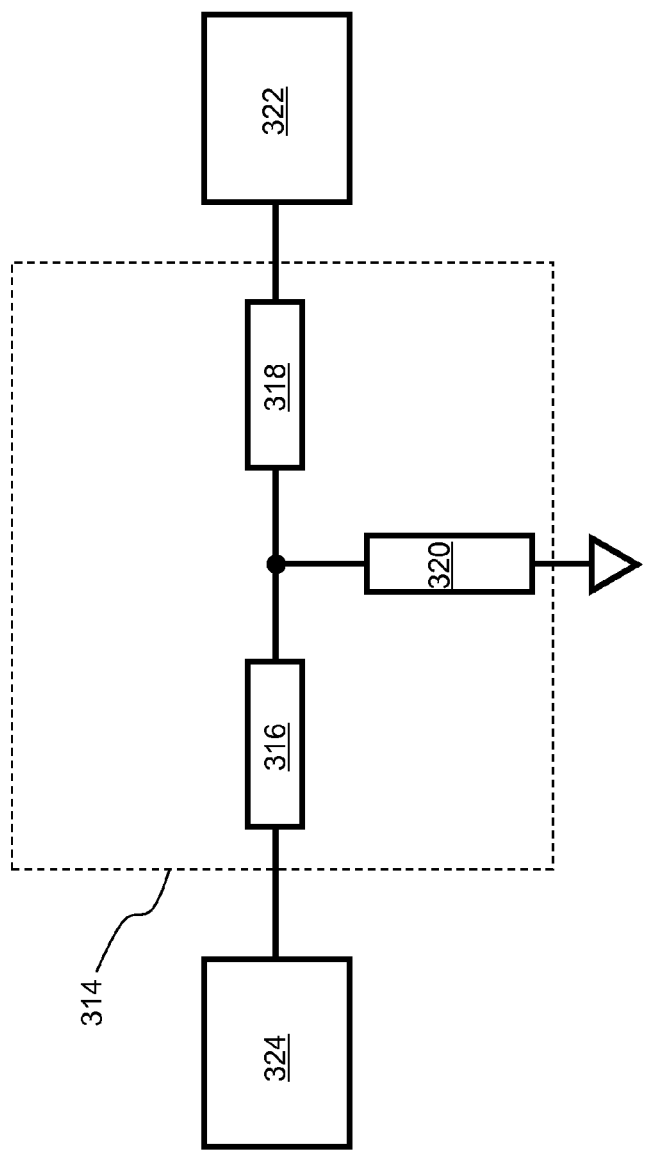
FIG. 3B illustrates an impedance matching circuit that can be implemented in a matching module of the test system shown in FIG. 3A in accordance with one embodiment of the present invention.

FIG. 3B illustrates an impedance matching circuit 314 that can be implemented in the matching module 308 shown in FIG. 3A in accordance with one embodiment of the present invention. The impedance matching circuit 314, which includes inductors 316, 318 and a capacitor 320, is implemented between an antenna interface 324 coupled to the probe array 304 shown in FIG. 3A and an RF tester 322. The inductors 316 and 318 are serially connected with the capacitor connected there between in parallel in order to couple RF signals between the antenna interface 324 and the RF tester 322. The matching circuit 314 allows RF signals to be converted into DC signals, thereby allowing the test apparatus 302 to test RF dice on the semiconductor wafer 306, as shown in FIG. 3A.

Figure 3C:
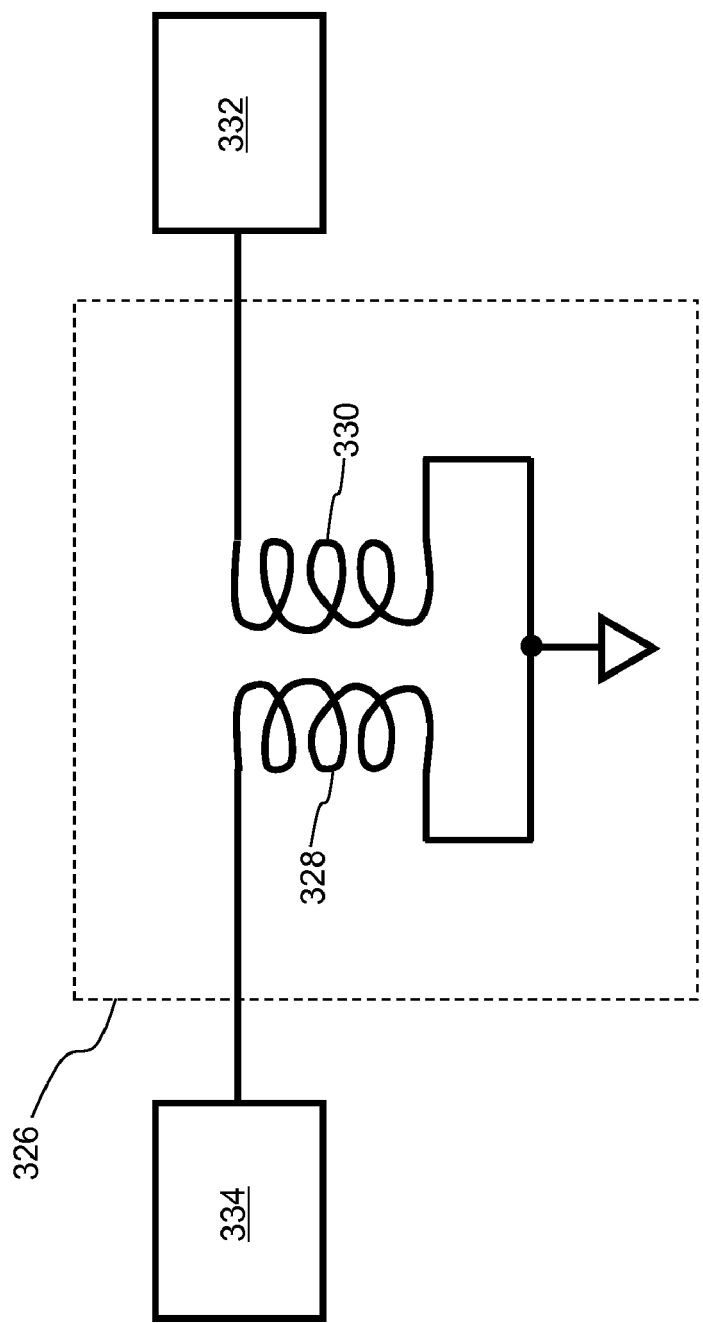
FIG. 3C illustrates a transformer circuit that can be implemented in a matching module of the test system shown in FIG. 3A in accordance with one embodiment of the present invention.

FIG. 3C illustrates a transformer circuit 326 that can also be implemented in the matching module 308 shown in FIG. 3A in accordance with one embodiment of the present invention. The transformer circuit 326 includes two inductors 328 and 330, and is implemented between an antenna interface 334 coupled to the probe array 304 shown in FIG. 3A and a RF tester 332. The transformer circuit 326 allows RF signals to be converted into DC signals, thereby allowing the test apparatus 302 to test RF dice on the semiconductor wafer 306, as shown in FIG. 3A.

One of the advantages of the invention is that the time needed for testing a semiconductor wafer can be reduced significantly due to a reduced number of probe repositioning. For example where a semiconductor wafer has 79,920 dice, the dices can be grouped into 555 sets with each having 114 dice. In this example, the probes only need to be repositioned 555 times to complete the test of the wafer. However, in a conventional test scheme, the probes may need to be repositioned 79,920 times to complete the test. As a result, the proposed test scheme can reduce the test time significantly, thereby reducing the manufacturing costs of the wafer. Another advantage of the invention is that the proposed scheme with the antenna coupling device can be used to test RF dice, which may not be readily tested by conventional test schemes.

The BIST dice and regular dice can be constructed on a semiconductor wafer by various processes. In one embodiment of the present invention, a mask set is used to form both the BIST dice and regular dice on the semiconductor wafer. During photolithography processes, a layer of photoresist material is coated over the wafer, and then exposed to light for transferring circuit patterns from the mask set to the photoresist layer. The transferred patterns include those for the regular dice and those for the BIST dice. Thus, one mask set would be sufficient. In another embodiment of the present invention, two mask sets are used to form the BIST dice and regular dices on a semiconductor wafer. One of the mask sets includes patterns for making the regular dice and the other mask set includes patterns for making the BIST dice. As such, two separate photolithography processes will be needed to transfer the patterns from the two mask sets to the photoresist layer coated on the semiconductor wafer for forming the two types of dice.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A test system comprising:
    a set of dice under test (DUT) connected together by a plurality of signal buses formed on a semiconductor wafer;
    at least one built-in self test (BIST) die formed separate from the set of DUT, the BIST die being connected to each DUT within the set through the signal buses for carrying out tests of each DUT;
    a probe array with a probe card including a set of probes for forming electrical contacts with the DUT via one or more pads on the BIST die, wherein the probe card includes at least one multiplexer;
    a test apparatus coupled to the probe card for sending test signals to the multiplexer of the probe card to select any DUT within the set, and for receiving output signals from the DUT for analysis through the multiplexer without repositioning the set of probes, the test apparatus comprises:
    a control device for analyzing the output signals from the DUT and for providing address signals to the probe card via an addressing bus, the probe card providing a plurality of physical connections to the BIST die for selecting one or more DUTs for testing based on the address signals;
    a set of testers coupled to the control device; and
    a set of matching modules configured to couple radio frequency (RF) signals between the probe card and the set of testers, wherein the probe array is directly coupled to the control device via an address bus to receive the address signals from the control device, and is further coupled to the control device via the matching modules and the testers to provide the RF signals from selected DUTs to the control device for analysis.

2. The system of claim 1 wherein the one or more pads on the BIST die comprise one or more address probing pads for receiving the address signals indicating an address of at least one DUT from the test apparatus via the set of probes, and one or more power supply probing pads for receiving power from the test apparatus via the set of probes.

3. The system of claim 1 wherein the set of probes comprises at least two test signal probes for passing the test signals, at least three address probes for passing the address signals to select one or more DUT, and at least two power probes for providing the DUT with power.

4. The system of claim 1 wherein the signal buses are routed along scribe lines among the DUT.

5. The system of claim 1 wherein the signal buses are routed along X scribe lines and Y scribe lines among the DUT.

6. The system of claim 1 wherein the DUT is a RF chip.

7. The system of claim 1 wherein each DUT has a seal ring with one or more feed-through paths, through which one or more tacks are disposed to form electrical connections between the signal buses routed along scribe lines and electrical components within each DUT.

8. The system of claim 1 wherein the set of testers comprise one or more RF testers coupled between the control device and the set of matching modules.

9. The system of claim 1 wherein the set of matching modules includes a transformer circuit constructed by one or more inductors to convert the RF signals into DC signals.

10. The system of claim 1 wherein the set of matching modules includes an impedance matching circuit constructed by at least one inductor and at least one capacitor to convert the RF signals into DC signals.

11. A test system for testing a radio frequency device, comprising:
a set of dice under test (DUT) connected together by a plurality of signal buses formed on the semiconductor wafer;
one or more built-in self test (BIST) die formed separate from the set of DUT, the BIST die being connected to each DUT within the set through the signal buses for carrying out tests of each DUT;
a probe array with a probe card including a set of RF probes operatively connected to one or more pads on the BIST die for passing test signals, wherein the probe card includes at least one multiplexer;
a test apparatus coupled to the probe card for sending the test signals to the multiplexer of the probe card to select any DUT within the set, and for receiving output signals from the DUT for analysis through the multiplexer without repositioning the set of probes, the test apparatus comprises:
a control device for analyzing the output signals from the DUT and for providing address signals to the probe card via an addressing bus, the probe card providing a plurality of physical connections to the BIST die for selecting one or more DUTs for testing based on the address signals;
a set of testers coupled to the control device; and
a set of matching modules configured to couple RF signals between the probe card and the set of testers, wherein the probe array is directly coupled to the control device via an address bus to receive the address signals from the control device, and is further coupled to the control device via the matching modules and the testers to provide the RF signals from selected DUTs to the control device for analysis.

12. The system of claim 11 wherein the one or more pads on the BIST die comprise one or more address probing pads for receiving the address signals indicating an address of at least one DUT from the test apparatus via the set of probes, and one or more power supply probing pads for receiving power from the test apparatus via the set of probes.

13. The system of claim 11 wherein the set of probes comprises at least two test signal probes for passing the test signals, at least three address probes for passing the address signals to select one or more DUT, and at least two power probes for providing the DUT with power.

14. The system of claim 11 wherein the signal buses are routed along scribe lines among the DUT.

15. The system of claim 11 wherein the signal buses are routed along X scribe lines and Y scribe lines among the DUT.

16. The system of claim 11 wherein the DUT is a RF chip.

17. The system of claim 11 wherein each DUT has a seal ring with one or more feed-through paths, through which one or more tacks are disposed to form electrical connections between the signal buses routed along scribe lines and electrical components within each DUT.

18. The system of claim 11 wherein the set of testers comprise one or more RF testers coupled between the control device and the set of matching modules.

19. The system of claim 11 wherein the set of matching modules includes a transformer circuit constructed by one or more inductors to convert the RF signals into DC signals.

20. The system of claim 11 wherein the set of matching modules includes an impedance matching circuit constructed by at least one inductor and at least one capacitor to convert the RF signals into DC signals.

* * * * *